US006459332B2

(12) United States Patent
Uchida

(10) Patent No.: US 6,459,332 B2
(45) Date of Patent: Oct. 1, 2002

(54) DIGITALLY-OPERATED ANALOG BUFFER AMPLIFIERS

(76) Inventor: Yasuhisa Uchida, 7-kumi, Takenoue, Oita-shi, Oita-ken (JP)

( * ) Notice: Subject to any disclaimer, the term of this patent is extended or adjusted under 35 U.S.C. 154(b) by 0 days.

(21) Appl. No.: 09/803,752

(22) Filed: Mar. 12, 2001

(51) Int. Cl.[7] .............................. G06G 7/12; H03L 5/00

(52) U.S. Cl. ........................................ 327/563; 327/333

(58) Field of Search .............................. 327/52, 54, 67, 327/70, 309, 312, 321, 333, 374, 563

(56) References Cited

U.S. PATENT DOCUMENTS

| | | | | |
|---|---|---|---|---|
| 5,818,278 A | * 10/1998 | Yamamoto et al. | ......... | 327/333 |
| 5,929,502 A | * 7/1999 | Beasom | ...................... | 257/497 |
| 6,111,901 A | * 8/2000 | Taguchi et al. | ............... | 372/38 |
| 6,130,562 A | * 10/2000 | Bosch et al. | ................ | 327/109 |
| 6,130,575 A | * 10/2000 | Nelson et al. | .............. | 327/540 |

* cited by examiner

*Primary Examiner*—My-Trang Nu Ton
(74) *Attorney, Agent, or Firm*—Irving Keschner

(57) ABSTRACT

Digitally-operated analog buffer amplifiers which are characterized by small circuits, no offset voltage, high speed and low power consumption. Circuit means are provided so that when the value of the output voltage of the buffer amplifier nears the approximate value (set voltage value) of the input voltage value, the input terminal and output terminal short-circuit so that the output voltage and the input voltage are made equal, thereby preventing the generation of offset voltage. Power consumption is reduced because the circuit completes the operation in a digital operation state.

6 Claims, 5 Drawing Sheets

DIGITALLY-OPERATED ANALOG BUFFER AMPLIFIERS

BACKGROUND OF THE INVENTION

1. Field of the Invention

The present invention provides positive and negative directional digitally operated buffer amplifiers.

2. Description of the Prior Art

When load is connected to an analog signal (large-amplitude low-frequency alternating current) source that has no driving capability, it has been conventional to use a buffer amplifier between the signal source and the load so that the load will not affect signals. However, if the buffer amplifier consists of an operational amplifier in which MOS elements are used, offset voltage is generated due to the poor consistency of the MOS elements, thus causing errors to occur in the input signal source voltage and the output voltage.

SUMMARY OF THE PRESENT INVENTION

The present invention provides digitally-operated analog buffer amplifiers which are characterized by small circuits, no offset voltage, high speed and low power consumption.

In accordance with the teachings of the present invention, circuit means are provided so that when the value of the output voltage of the buffer amplifier nears the approximate value (set voltage value) of the input voltage value, the input terminal and output terminal short-circuit so that the output voltage and the input voltage are made equal, thereby preventing the generation of offset voltage. Power consumption is reduced because the circuit completes the operation in a digital operation state.

DESCRIPTION OF THE DRAWINGS

For better understanding of the present invention as well as other objects and further features thereof, reference is made to the following description which is to be read in conjunction with the accompanying drawing therein:

FIG. 1(*b*) the circuit diagram thereof;

FIG. 2(*b*) the circuit diagram thereof;

DESCRIPTION OF THE INVENTION

Figure 1A:
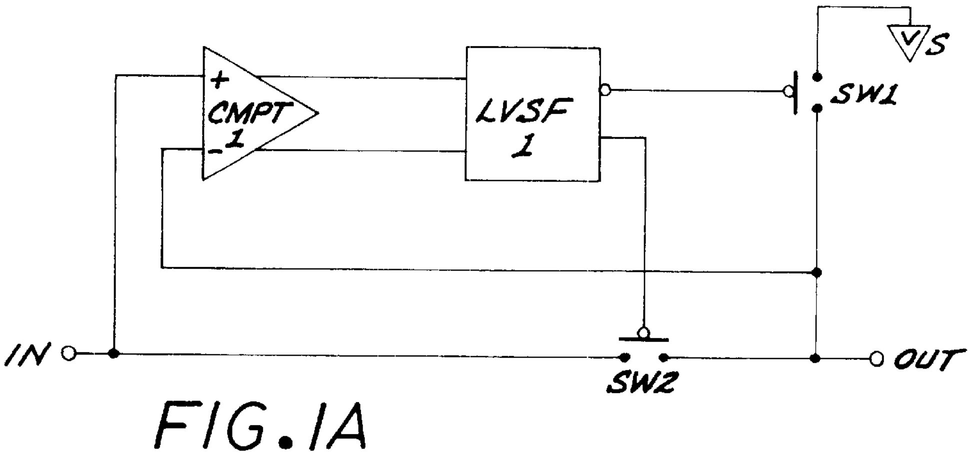
FIG. 1(*a*) is a block diagram of a first embodiment of the present invention.
Figure 1B:
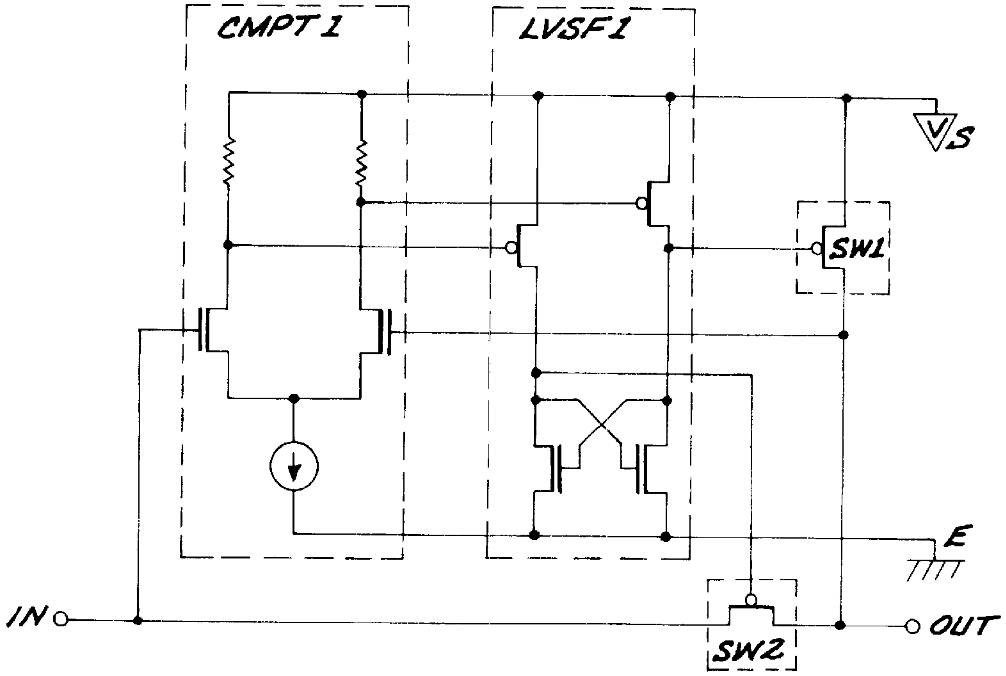

Referring now to FIG. 1, a block diagram of the positive directional digitally operated analog buffer amplifier embodiment of the present invention is illustrated.

Comparator CMPT1 is connected to input terminal IN and output terminal OUT so as to compare the input voltage and the output voltage.

Level shifter LVSF1 is connected to the output section of CMPT1 so as to amplify and convert the output voltage level of CMPT1 to the power source and earth voltage levels; switch SW1 is connected so as to short-circuit and release power source S and OUT; also, SW1 is controlled by the inversion output of LVSF1. Switch SW2 is connected so as to short-circuit and release IN and OUT; and the input of SW2 is controlled by the positive output of LVSF1.

If the input terminal voltage is higher than the output terminal voltage, SW2 is controlled so as to release IN and OUT; at the same time, SW1 short-circuits S and OUT; and if the output terminal voltage rises in the direction of the power source voltage level and reaches a pre-set voltage, which is lower than the input terminal voltage, SW1 is released so that the rise in the output terminal voltage halts, SW2 short-circuits at the same time and the input terminal voltage and output terminal voltage become equal.

Figure 2A:
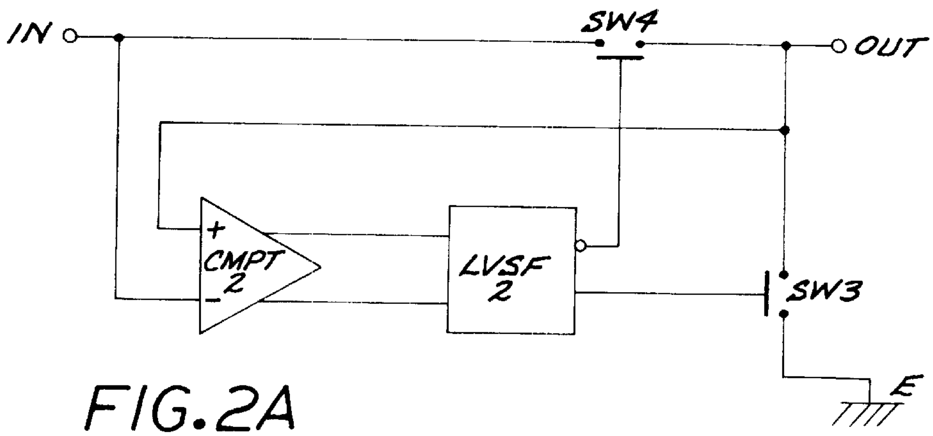
FIG. 2(*a*) is a block diagram showing a second embodiment example of the present invention.
Figure 2B:
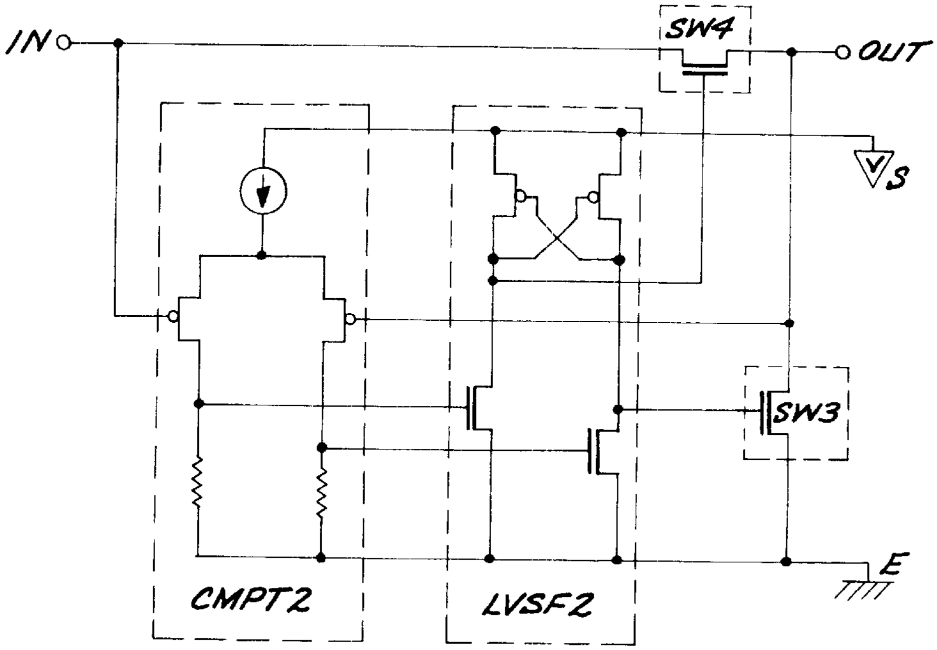

Referring now to the negative-directional digitally-operated analog buffer amplifier embodiment shown in FIG. 2, Comparator CMPT2 is connected to input terminal IN and output terminal OUT so as to compare the input voltage and the output voltage. Level shifter LVSF2 is connected to the output section of CMPT2 so as to amplify and convert the output voltage level of CMPT2 to the power source and earth voltage levels. Switch SW3 is connected so as to short-circuit and release earth E and OUT; also, SW3 is controlled by the positive output of LVSF2.

Switch SW4 is connected so as to short-circuit and release IN and OUT; and the input of SW4 is controlled by the inversion output of LVSF2.

If the input terminal voltage is lower than the output terminal voltage, SW4 is controlled so as to release IN and OUT; at the same time, SW3 short-circuits E and OUT; and when the output terminal voltage drops in the direction of the earth voltage level and reaches a pre-set voltage, which is higher than the input terminal voltage, SW3 is released so that the drop in the output terminal voltage halts, SW4 short-circuits at the same time and the input terminal voltage and output terminal voltage become equal.

Figure 3:
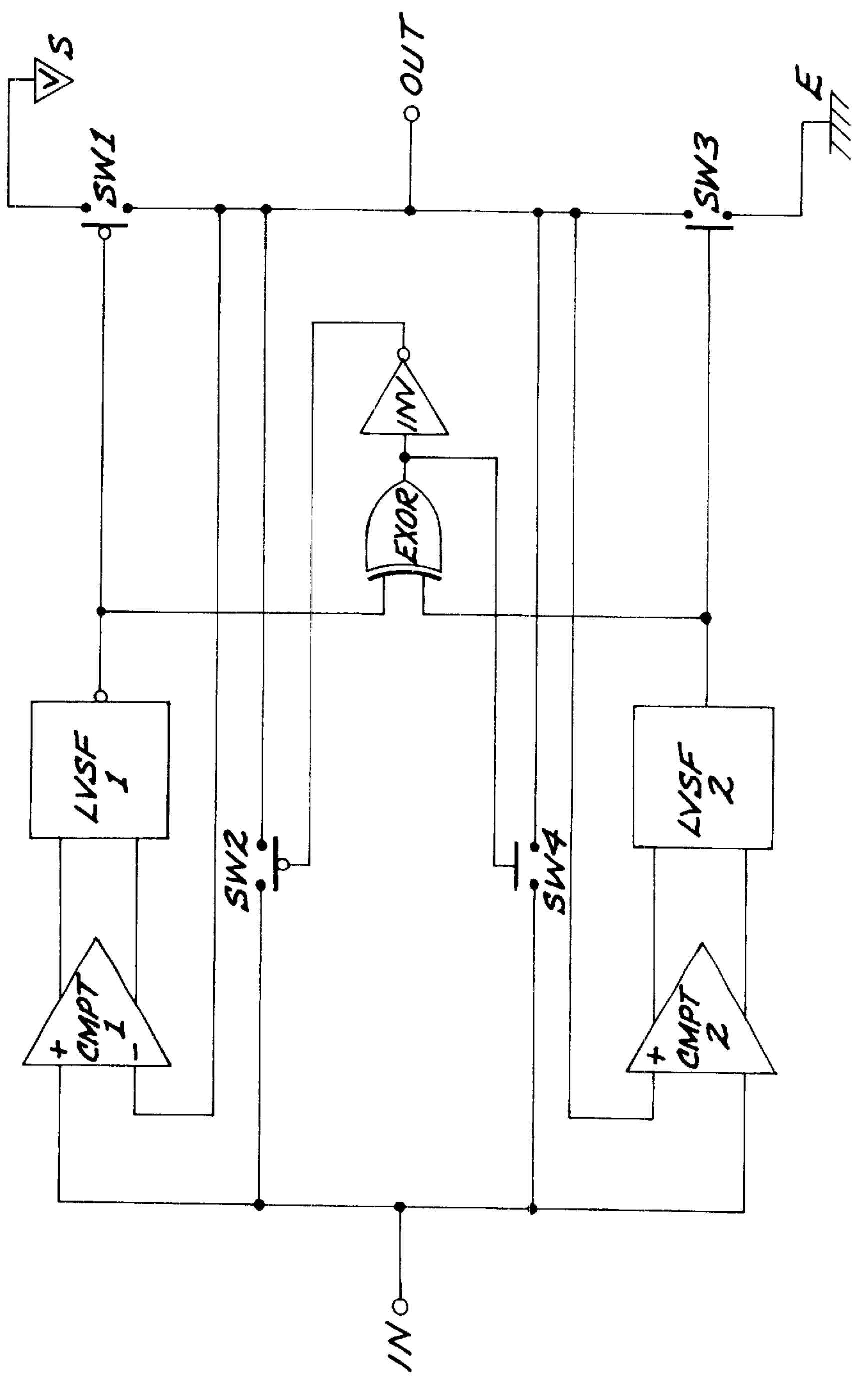
FIG. 3 is a block diagram showing a third embodiment of the present invention.

Referring to the digitally-operated analog buffer amplifier embodiment shown in FIG. 3, the output sections of LVSF1 and LVSF2 of the positive- and negative-directional digitally-operated analog buffer amplifiers are connected to the input section of Exclusive OR (logic seen) circuit EXOR; the output section of EXOR is connected to SW4 of the negative-directional digitally-operated analog buffer amplifier; also, SW4 is controlled by the output of EXOR.

The input section of inversion logic circuit INV is connected to the output section of EXOR; the output on INV is connected to SW2 of the positive-directional digitally-operated analog buffer amplifier; and SW2 is controlled by the output of INV; and if the input terminal voltage is higher than the output terminal voltage, SW2 and SW4 of the positive- and negative-directional digitally-operated analog buffer are controlled so as to release IN and OUT; at the same time, SW1 of the positive-directional digitally-operated analog buffer amplifier short-circuits; the output terminal voltage rises in the direction of the power source voltage level; and, at the same time, SW3 of the negative-directional digitally-operated analog buffer amplifier is in a released state; if the input terminal voltage is lower than the output terminal voltage, SW2 and SW4 of the positive- and negative-directional digitally-operated analog amplifiers are controlled so as to release IN and OUT; at the same time, SW3 of the negative-directional digitally-operated analog buffer amplifier short-circuits; the output terminal voltage drops in the direction of the earth voltage level; and, at the same time, SW1 of the positive-directional digitally-operated analog buffer amplifier is in a released state.

If the input terminal voltage approximates the output terminal voltage, SW2 and SW4 of the positive- and negative-directional digitally-operated buffer amplifiers are controlled so as to short-circuit IN and OUT; and, at the same time, SW1 and SW3 of the positive- and negative-directional digitally-operated analog buffer amplifiers are released.

The digitally-operated analog buffer amplifiers embodiments mentioned hereinabove are capable of adjusting the set voltage by varying the size of the elements of CMPT1 and CMPT2.

In addition, the comparators of the digitally-operated analog buffer amplifiers are structured so that the size of the elements of CMPT1 and CMPT2 are controlled by a switch, thereby varying the set of voltage so as to provide the hysterisis characteristics.

Operations of digitally-operated analog buffer amplifiers of the present invention will be explained below by referring to the block diagram shown in FIG. 3. CMPT1, LVSF1, SW1 and SW2 serve as a buffer amplifier in the positive direction (the direction toward the power source) and CMPT2, LVSF2, SW3 and SW4 serve as a buffer amplifier in the negative direction (the direction toward earth voltage). The control input terminals of SW1 and SW2 show that they are closed “L” level signal. The exclusive logical sum treatment is applied to the outputs of LVSF1 and LVSF2 and the summed outputs and its inversion signal control SW2 and SW4.

When the input voltage becomes higher than the output voltage, CMPT1 detects this and turns the output of LVSF1 to “L”. Here, the output of CMPT2 does not change and the output of LVSF2 remains in “L”; thus, the output of EXOR becomes “L” and the output of INV becomes “H” so that SW2 and SW4 are released. At the same time, SW3 is released and SW1 is short-circuited so that the output voltage rises in the direction of the power source voltage.

When the output voltage reaches the set voltage, which is lower than the input voltage, CMPT1 detects this and the output of LVSF1 changes from “L”to “H”. Also, the output of EXOR changes from “L” to “H”, and the output of INV changes from “H”to “L”. Thus, SW1 is released and SW2 and SW4 are short-circuited so that the output voltage rises to a voltage level equal to the input voltage and halts there. As the output voltage rises to a voltage level that is higher than the set voltage, the output of LVSF1 becomes a complete “H”, and the operation completes in a stable digital state.

When the input voltage becomes lower than the output voltage, CMPT 2 detects this and turns the output of LVSF2 to “H”. Here, the output of CMPT1 does not change and the output of LVSF1 remains in “H”; thus, the output of EXOR becomes “L”and the output of INV becomes “H”so that SW2 and SW4 are released. At the same time, SW1 is released and SW3 is short-circuited so that the output voltage drops in the direction of the earth voltage. When the output voltage reaches the set voltage, which is higher than the input voltage, CMPT2 detects this and the output of LVSF2 changes from “H”to “L”. Also, the output of EXOR changes from “L”and “H”, and the output of INV changes from “H”to “L”. Thus, SW3 is released and SW2 and SW4 are short-circuited so that the output voltage drops to a voltage level equal to the input voltage and halts there. As the output voltage drops to a voltage level that is lower than the set voltage, the output of LVSF2 becomes a complete “L”, and the operation completes in a stable digital state.

As the operation completes with SW2 and SW4 short-circuited as mentioned above, offset voltage, which is seen in buffer amplifiers using operational amplifiers, is not generated. Also, as the operation completes in stable digital state and direct current is consumed only by the comparator, power consumption is low. Further, the operation is very speedy and stable because it is digital.

Figure 4:
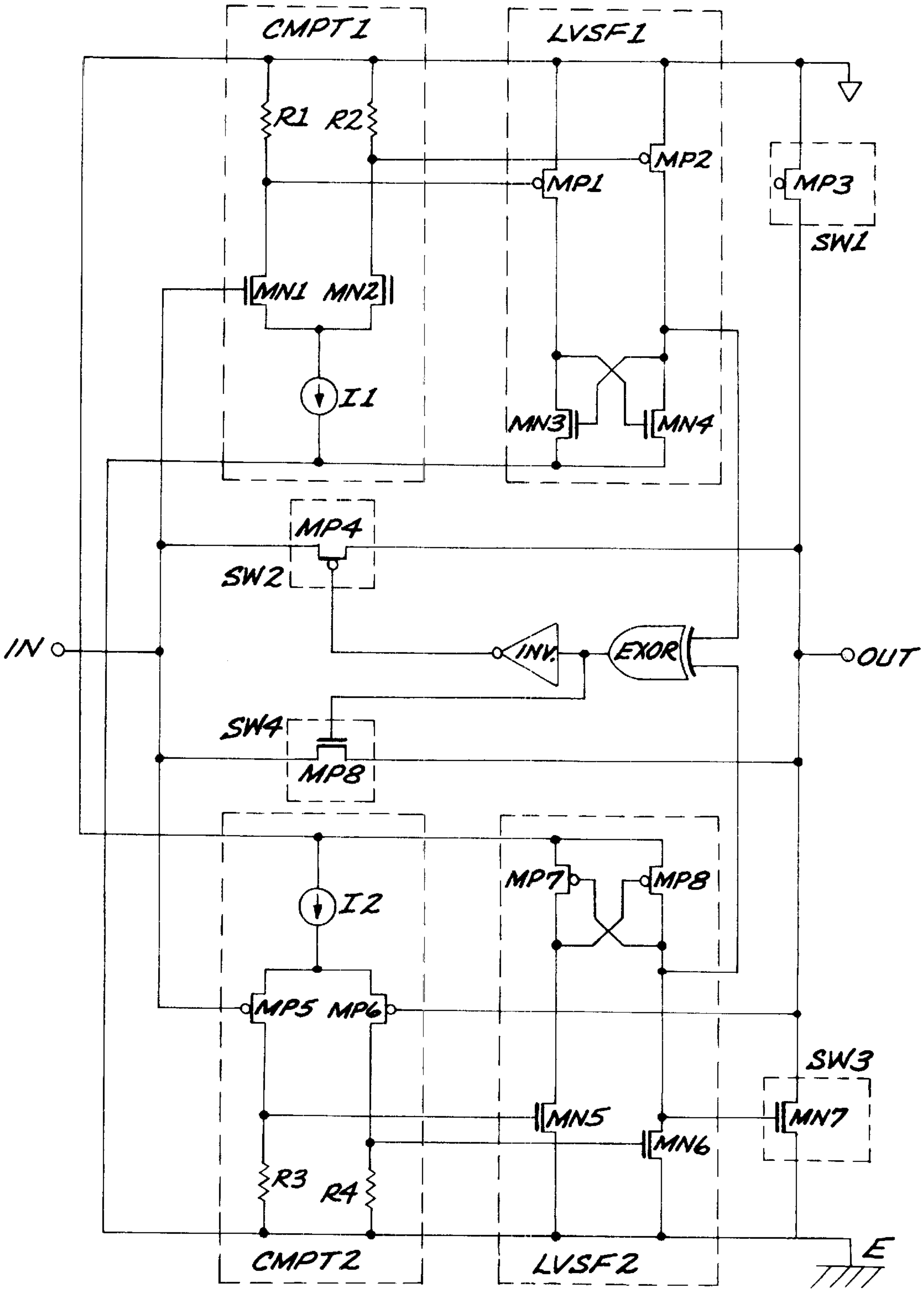
FIG. 4 is a circuit diagram showing a fourth embodiment of the present invention.

FIG. 4 illustrates a further use of the concept of the invention. The ratios of gate width (W) and gate length (L) (W/L) are different in the transistors MN1 and MN2 in CMPT1; and the difference provides the set voltage. In FIG. 4, the ratio W/L in MN2 is larger than that in MN1, which decreases the threshold voltage so that MN2 incurs the switching of current from MN1 to MN2 by way of a voltage that is lower than the gate voltage of MN1. As the result, the output of LVSF1 is switched due to voltage fluctuations (drops) in resistors R1 and R2.

Similarly, the ratios (W/L) of the gate width and the gate length of the transistors MP5 and MP6 in CMPT2 are different. The threshold voltage decreases when W/L of MP6 is larger than that of MP5. Thus, the switching of current occurs to MP6 with: a gate voltage that is higher than that of MP5.

The set voltage can be freely changed by changing the ratio W/L. Also, high-speed operations corresponding to load conditions are possible by changing the set voltage temporarily. When a large time-constraint load is applied, it may take a while for the output voltage to reach the input voltage level with SW2 and SW4 short-circuited. The time can be shortened by temporarily overshooting or undershooting the output voltage so as to offset the overshoot (or undershoot) and the difference.

Figure 5:
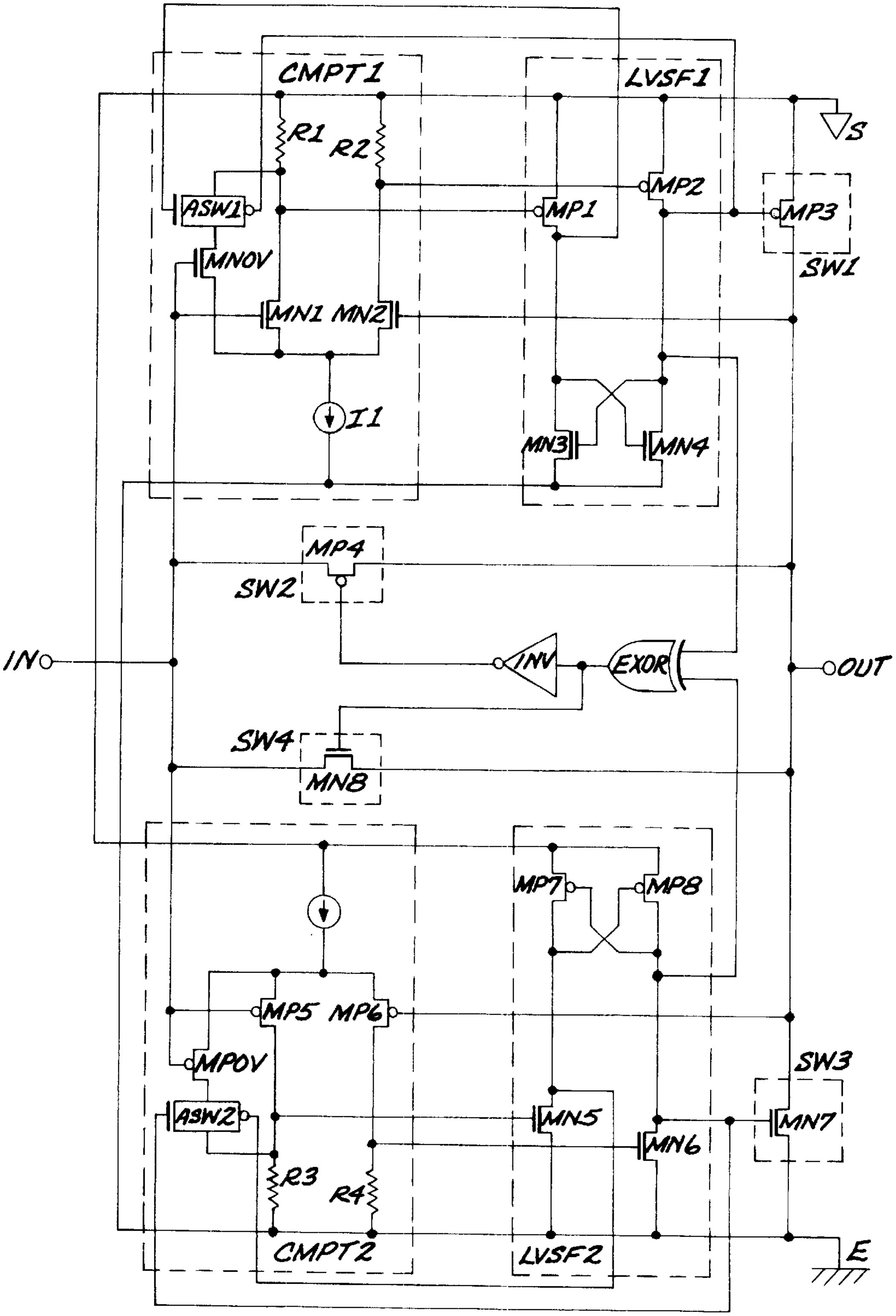
FIG. 5 is a circuit diagram showing a fifth embodiment of the present invention which incorporates overshooting or undershooting characteristics.

FIG. 5 shows a further version of the circuit shown in FIG. 4. In particular, a transistor MNOV is added to MN1 in CMPT1 so as to temporarily change the ratio W/L (i.e. to have a large W/L ratio). The switch ASW1 short-circuits only when the input voltage becomes higher than the output voltage so as to make W/L of MN1 larger than that of MN2 temporarily.

Thus, the set voltage value becomes higher than the target voltage value and overshooting is possible. When the output voltage nears the set voltage value, the current that has flowed only through MN1 and MNOV will gradually flow through MN2. IF LVSF1 is set so as to inverse with such a change of current, ASW1 is released, the set voltage value fluctuates (drops) as if it drops downward sharply and the current flows only through MN2.

The above is the same as the application of positive feedback; thus, the comparator’s threshold voltage characteristics show hysterisis characteristics. Thus, the output voltage temporarily overshoots and thereafter converges to the target value so that the circuit completes its operations in a stable digital operation state.

Similarly, undershooting is available by changing W/L of MP5 in CMPT2 temporarily. As mentioned above, it is possible to easily generate overshoot by adding a few elements so as to correspond to large time-constant loads.

This present invention thus prevents the generation of offset voltage; provides equal input signal source voltage and output voltage; drives at high speeds; and operates at a low power consumption level.

While the invention has been described with reference to its preferred embodiments, it will be understood by those skilled in the art that various changes may be made and equivalents may be substituted for elements thereof without departing from the true spirit and scope of the invention. In addition, many modifications may be made to adapt a particular situation or material to the teachings of the invention without departing from its essential teachings.

What is claimed is:

1. An analog buffer amplifier which is operated digitally in the positive direction comprising a comparator, a level shifter and first and second switches, said comparator being connected to the input terminal and the output terminal of the buffer amplifier so as to compare the input voltage and the output voltage; said level shifter being connected to the output section of said comparator so as to amplify and convert the output voltage level of said comparator to the power source and earth voltage levels; said first switch being connected so as to short-circuit and release the power source and the output terminal said first switch being controlled by the inversion output of the level shifter; said second switch being connected so as to short-circuit and release the input terminal and the output terminal; the input of said second switch being controlled by the positive output of the level shifter; if the input terminal voltage is higher than the output terminal voltage, said second switch is controlled so as to release the input terminal and the output terminal; first switch short-circuiting the power source and the output terminal when the output terminal voltage rises in the direction of the power source voltage level and reaches a pre-set voltage, which is lower than the input terminal voltage, said first switch is released so that the rise in the output terminal voltage halts, said second switch short-circuits at the same time, the input terminal voltage and output terminal voltage becoming substantially equal.

2. The analog buffer amplifier of claim 1 wherein the set voltage is adjusted by changing the size of the comparator element.

3. The analog buffer amplifier of claim 1 wherein the size of the comparator element are controlled the switches so as to change the set voltage, thereby providing hysterises characteristics.

4. An analog buffer amplifier which is operated digitally in the negative direction consisting of a comparator, a lever shifter and first and second switches, said comparator being connected to the input terminal and the output terminal so as to compare the input voltage and the output voltage; said level shifter being connected to the output section of said comparator so as to amplify and convert the output voltage level of said comparator to the power source and earth voltage levels; said first switch being connected so as to short-circuit and release the earth terminal and the output terminal, said first switch being controlled by the positive output of the level shifter; said second switch being connected so as to short-circuit and release the input terminal and the output terminal; the input of said second switch being controlled by the inversion output of the level shifter; said second switch being controlled so as to release the input terminal and the output terminal at the same time, said first switch short-circuiting the earth terminal and the output terminal if the input terminal voltage is lower than the output terminal voltage; when the output terminal voltage drops in the direction of the earth voltage level and reaches a pre-set voltage, which is higher than the input terminal voltage, said first switch is released so that the drop in the output terminal voltage halts, said second switch short-circuits at the same time and the input terminal voltage and output terminal voltage becoming substantially equal.

5. The analog buffer amplifier of claim 4, wherein the set voltage is adjusted by changing the size of the comparator elements.

6. The analog buffer amplifier of claim 4 wherein the size of the comparator elements are controlled by the switches so as to change the set voltage, thereby providing hysterisis characteristics.

* * * * *